United States Patent [19]

Jacobs et al.

[11] Patent Number: 5,190,835
[45] Date of Patent: Mar. 2, 1993

[54] METHOD OF REPAIRING A DEFECT IN A LITHOGRAPHIC MASK COMPRISING METAL DEPOSITION FROM SOLUTION VIA U.V. STIMULATED ELECTRON EMISSION

[75] Inventors: Johannes W. M. Jacobs; Christiaan J. C. M. Nillesen; Johannes M. G. Rikken, all of Eindhoven, Netherlands

[73] Assignee: U.S. Philips Corporation, New York, N.Y.

[21] Appl. No.: 663,502

[22] Filed: Mar. 1, 1991

[30] Foreign Application Priority Data

Mar. 5, 1990 [NL] Netherlands .......................... 9000502

[51] Int. Cl.$^5$ ............................................... G03F 9/00
[52] U.S. Cl. ........................................... 430/5; 430/4; 430/938; 427/304
[58] Field of Search ................... 430/4, 5, 296, 938; 427/304

[56] References Cited

U.S. PATENT DOCUMENTS

| | | | |
|---|---|---|---|
| 4,426,442 | 1/1984 | Molenaar et al. | 430/413 |
| 4,853,320 | 8/1989 | Jacobs et al. | 430/413 |
| 4,906,326 | 3/1990 | Amemiya | 430/5 |

Primary Examiner—Marion E. McCamish
Assistant Examiner—S. Rosasco
Attorney, Agent, or Firm—Paul R. Miller

[57] ABSTRACT

The invention provides a method by which a transparent defect (3) in a lithographic mask (1) can be effectively restored in a simple manner. For this purpose, the mask (1) is provided with a photosensitive layer (4) and is introduced into a solution of a metal ion (5). Subsequently, the mask is exposed at the area of the defect. The photosensitive layer (4) is capable of depositing the metal ion in the form of metal under the influence of the radiation (6) supplied. According to the invention, the exposure is continued until such a quantity of metal (7) has been deposited that the radiation can no longer penetrate to the photosensitive layer (4). At that instant, the metal deposition is stopped so that overgrowth of the metal deposit (7) is automatically counteracted in a simple manner.

21 Claims, 2 Drawing Sheets

METHOD OF REPAIRING A DEFECT IN A LITHOGRAPHIC MASK COMPRISING METAL DEPOSITION FROM SOLUTION VIA U.V. STIMULATED ELECTRON EMISSION

The invention relates to a method of repairing a defect in a mask pattern of a lithographic mask, in which the mask is provided with a photosensitive layer, which upon exposure to radiation having such a wavelength that it is absorbed by the layer is capable of depositing a metal from a solution of the metal ion and in which the mask is introduced into the solution and is exposed to the radiation at the area of the defect.

Such masks are used especially in the semiconductor technology, but masks of the kind described above can also be used in other fields, such as LCD (Liquid Crystal Display). It should otherwise be noted that the invention can be used for any type of mask, for example, such as so-called reticles, and also that the kind of lithography for which the mask is intended is not of essential importance for the usability of the invention. The invention can be used both for a mask for lithography with visible or invisible light and, for example, for a mask intended for electron or X-ray lithography. In all cases, the mask comprises an at least substantially transparent substrate, on which a pattern opaque to the radiation to be used is provided, which mostly consists of metal.

During the manufacture, defects may occur, for example, in the form of small apertures in the pattern, which may be due, for example, to the presence of dust particles. In view of the high cost involved in the manufacture of a mask, it is usually preferred to restore or repair such defects in this case instead of manufacturing a new mask. The invention provides such a method of repairing.

BACKGROUND OF THE INVENTION

A method of the kind mentioned in the opening paragraph is known from Netherlands patent application laid open to public inspection under No. 8702219, corresponding to U.S. Pat. No. 4,853,320. In the method described therein, a nuclei image in the form of a number of loose metal nuclei is deposited at the area of the defect during a comparatively short exposure. Subsequently, the mask is introduced into an electroless metallization solution, in which the nuclei image is intensified without further exposure. Metal is then deposited from a metallization solution selectively only on the nuclei or already deposited metal. By removing the mask from the solution, the intensification is terminated.

In the known method, however, the metal image is not fully limited to the exposed part of the mask. Due to lateral growth, at the edge of the nuclei image metal will be deposited also outside the exposed part. In order that this is limited to a minimum, the mask should be removed from the metallization solution as soon as possible after a sufficient quantity of metal has been deposited. However, the substrate must not be removed too early from the solution because the metal deposit is then not optically light-tight and the defect will not be fully restored. Especially if more defects are restored at the same time, in which event due to process tolerances one defect will inevitably be restored earlier than the other, this is disadvantageous. However, even if only one defect is restored, such an overgrowth is disadvantageous due to the fact that this results in that the resolution of the method of repairing is reduced. Especially in the modern LCD and semiconductor technology, in which masks are used with details of only a few microns or even smaller, this is disadvantageous.

SUMMARY OF THE INVENTION

The invention has inter alia for its object to provide a method of the kind mentioned in the opening paragraph, in which overgrowth is counteracted so that the ultimate metal deposit is at least substantially completely located on the exposed part of the mask.

According to the invention, a method of the kind mentioned in the opening paragraph is characterized in that continued exposure at the area of the defect deposits such a quantity of metal on the photosensitive layer that the photosensitive layer in situ becomes at least substantially inaccessible for radiation.

According to the invention, in contrast with the known method, after formation of a nuclei image the exposure is therefore not stopped, after which the nuclei image is developed further in an electroless metallization solution, but the exposure is continued until the required thickness is reached. The invention is based on the recognition of the fact that, due to the fact that use is made of a photochemical process, in which metal deposition can take place only if the photosensitive layer is exposed, and a longer exposure and a longer residence in the solution will result, after the thickness aimed at has been reached, in any further metal deposition neither in the direction of thickness nor in the lateral direction, so that any overgrowth is automatically stopped. It has further been recognized that just at the instant at which the photosensitive layer has become inaccessible for the radiation supplied and the metal deposition is stopped, the metal deposit has attained the required light-tightness. Thus, an unnecessary metal deposition is counteracted, which favours the resolution of the method, so that small defects of only a few microns or smaller can also be restored accurately. The method according to the invention is therefore also particularly suitable for use in the modern LCD and semiconductor technology. Moreover, the method is less sensitive to process tolerances than the known method, which is of particular importance if a number of defects in the mask are restored simultaneously.

In order to improve the adhesion of the metal deposit to the mask, the exposure to radiation is preferably carried out initially with a comparatively high intensity, after which the exposure is continued with a lower intensity. Due to the initial high intensity, a comparatively large number of metal nuclei are formed on the surface per unit surface area. The ultimate metal deposit will consequently have a comparatively large number of points of adhesion to the surface of the mask. By afterward reducing the intensity of the exposure, thermal effects, such as boiling phenomena and turbulences, are counteracted.

The photosensitive layer can be provided both before and after the mask pattern. Preferably, however, there is started from a mask in which the photosensitive layer is provided below the mask. The photosensitive layer is located in this case between the mask pattern and the substrate. This has the advantage that, when an interruption in the mask pattern is restored, the mask pattern itself screens the photosensitive layer at the edge of the interruption. If during the process of repairing the exposed part of the mask surface extends outside the interruption over the mask pattern, it is thus counteracted that metal is also deposited at that area.

BRIEF DESCRIPTION OF THE DRAWINGS

The invention will now be described more fully with reference to a drawing and a number of embodiments. In the drawing.

The Figures are purely schematic and not drawn to scale. For the sake of clarity, especially certain dimensions are strongly exaggerated.

DESCRIPTION OF THE INVENTION

Figure 1:
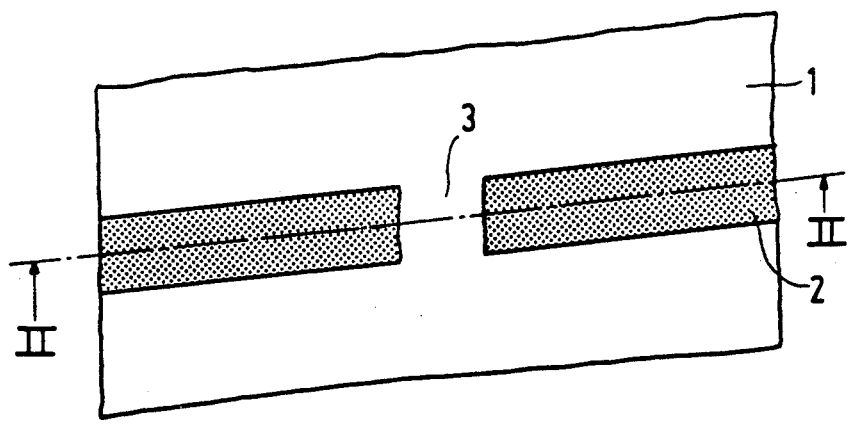
FIG. 1 is a plan view of a part of a photolithographic mask.

FIG. 1 is a plan view of a photolithographic mask. The mask comprises a transparent substrate 1, mostly of quartz, on which an opaque pattern 2 is provided. For the sake of clarity, the Figure shows in part only one track 2 of the pattern. A metal is mostly used for the pattern 2, as also in this case, in which the pattern consists of chromium. However, the invention may also be used if another material, such as, for example, a compound on an organo-metallic compound is chosen for the mask pattern.

Although the track 2 should be uninterrupted, it has an interruption 3, which is due, for example, to a dust particle which has adhered to the surface of the substrate during the manufacturing process. The present invention provides a method by which such a transparent defect 3 can be obviated efficaciously and with a high resolution.

Figure 2:
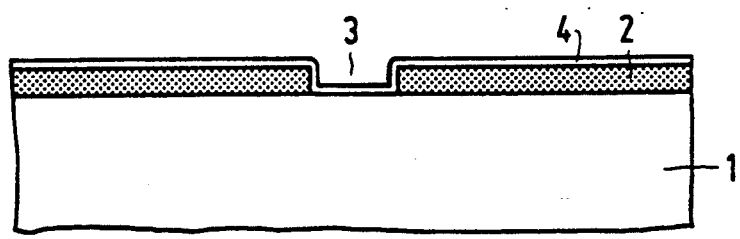
FIGS. 2, 3 and 4 show cross-sections of the mask of FIG. 1 in subsequent stages of repair according to a first embodiment of the invention.

For this purpose, the mask is first cleaned and degreased thoroughly by means of usual cleaning agents for this purpose. Subsequently, a thin photosensitive layer 4 of titanium dioxide is provided on the whole surface, as is shown in FIG. 2. Instead of titanium dioxide, another photosensitive material may otherwise also be used, such as, for example, indium tin oxide (ITO), which in the LCD technology is a frequently used semiconductor material, or zinc oxide. In this example, the photosensitive layer 4 is applied by spinning, as a result of which a very small thickness of only 5 to 20 nm can be obtained.

Figure 3:
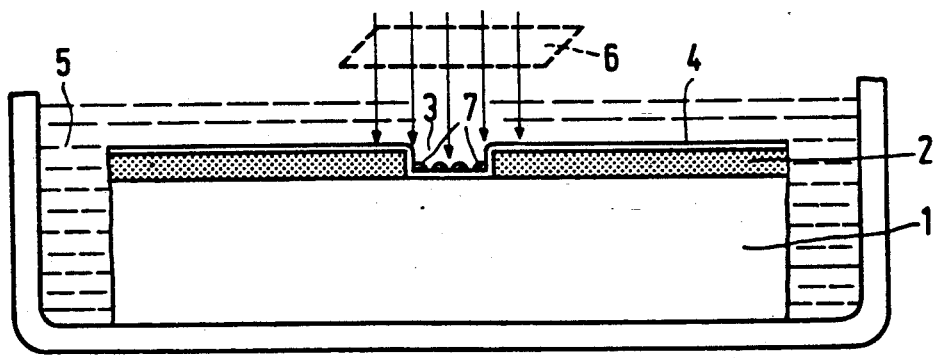

The mask is then introduced into a solution 5 of gold (I) sulphite ions $(Au(SO_3)^{3-}{}_2)$ (see FIG. 3) containing a part of a galvanic gold solution (10 g/l, commercially available as ECF-60, marketed by Engelhard), to which 4 parts of water, one half part of 0.2 M citric acid and half a part of isopropanol are added. The isopropanol in the solution ensures a higher deposition rate of the gold. Instead, another alcohol, such as, for example, methanol or ethanol, may otherwise also be used. In the citric acid, the degree of acidity of the solution is adjusted to $pH \approx 4.5$, which further improves the rate of deposition.

Subsequently, the mask is exposed at the area of the interruption 3 to UV radiation having a wavelength between 350 and 365 nm, for which purpose an argon laser is used, which is operated with a continuous power of about 100 mW. The mask is then preferably exposed through a rectangular diaphragm, whose length and width are adjustable. In this example, such a diaphragm is also used, as a result of which a rectangular luminous spot 6, whose length and width can be varied between 1 and 25 $\mu m$, is imaged on the mask.

The photosensitive titanium dioxide layer 4 is capable of absorbing the radiation supplied while forming free electrons. These electrons can then be transferred at the surface to the solution 5, where they reduce the disulphite gold ions to gold, which is deposited in the form of into the interruption 3. This process is continued as long as the titanium dioxide layer 4 is accessible for the laser light 6 and electrons are released. As soon as such a quantity of gold has been deposited that the laser light can no longer penetrate to the titanium dioxide layer 4, the process is stopped automatically. A longer exposure then does not result in any further metal deposition either in the direction of thickness or in the lateral direction, as a result of which overgrowth is limited. The inventors have recognized that just at that instant the gold deposit 7 has attained the light tightness required for the mask. Due to the fact that the metal deposition is automatically stopped at the correct instant, the method according to the invention is not very critical and is further particularly suitable if a number of defects are restored simultaneously.

Otherwise it should be noted that the exposure, which according to the invention is continued during the whole repairing process, a sufficient supply of electrons to the solution is always guaranteed, as a result of which the concurrent reduction of oxygen described in the method known from Netherlands patent application No. 8702219, corresponding to U.S. Pat. No. 4,853,320 in this case does not or substantially not play any important part.

Figure 4:
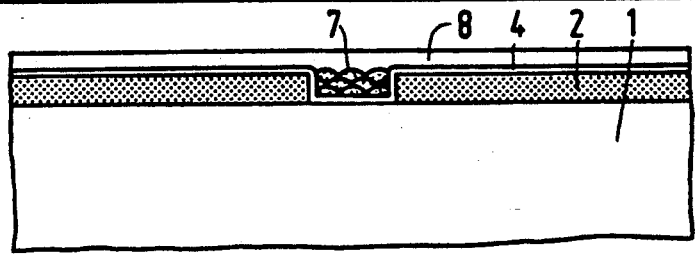

FIG. 4 shows the restored mask in cross-section. Instead of the earlier interruption in the mask pattern 2, gold 7 is deposited, which is sufficiently light-tight and scratch- and wear-resistant to render the mask usable. Thus, the cost is economized which would otherwise have been connected with the manufacture of an additional mask.

While it has been found that the gold deposit 7 formed is resistant to most usual mask cleaning methods and has also been capable of successfully withstanding experiments with respect to scratch and wear resistance, the resistance of the mask can be improved in that, after the mask has been restored, at least the restored parts are covered with a protective top layer 8. For this purpose, a layer can be used of the same material as the photosensitive layer 4, in this case titanium dioxide, which does not further complicate the repairing process. If the mask is intended to be used for UV lithography, however, titanium dioxide has the disadvantage that it slightly absorbs the radiation used in this case. In this event, it may be recommended to use another material, such as, for example, silicon dioxide, which is at least substantially fully transparent to UV radiation. The UV absorption is then limited to the photosensitive layer 4, which may be very thin. In this example, the mask is provided over the whole surface with an about 5 nm thick top layer 8 of titanium dioxide. The top layer 8 leads otherwise not only to an improvement of the scratch and wear resistance of the mask, but also to an increase of the chemical resistance.

Figure 5:
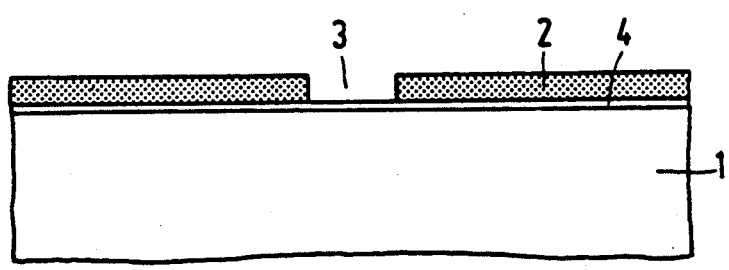
FIGS. 5, 6, 7, 8 and 9 show a mask in subsequent stages of repair according to a second embodiment of the invention.
Figure 6:
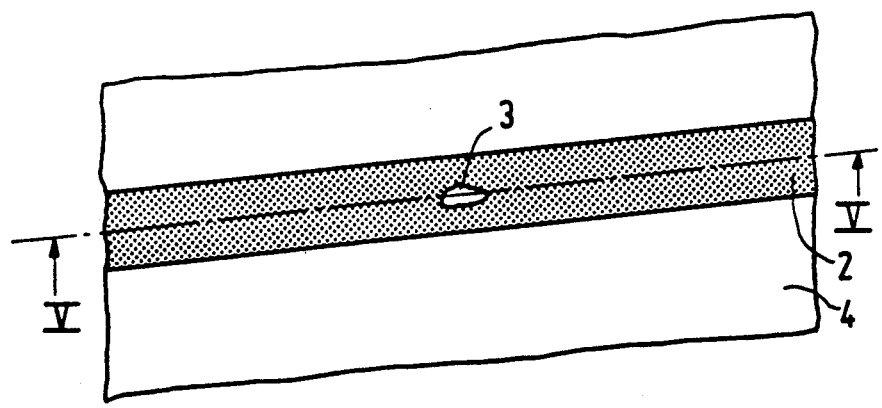

In a second embodiment of the method according to the invention, the second process is started from a mask in which the photosensitive layer 4 is provided between the substrate 1 and the mask pattern 2 (see FIG. 5). The pattern 2 has a mask defect in the form of a small aperture 3, which is shown in plan view in FIG. 6, which defect will be restored by the use of the invention.

Figure 7:
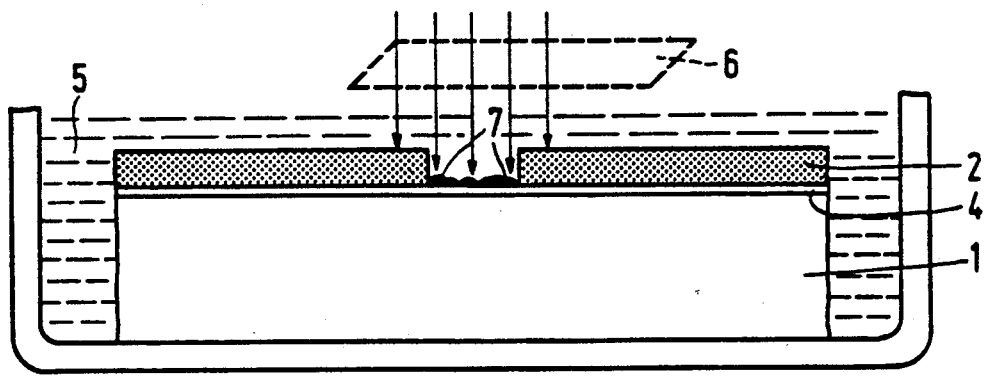

For this purpose, the mask is first cleaned and degreased thoroughly. Due to the fact that the photosensitive layer 4 is already present, the mask can then be directly introduced into a metal ion solution 5 (see FIG. 7). In this example, for this purpose a solution is used containing 1 g per liter of palladium chloride ($PdCl_2$), 10 ml of concentrated hydrochloric acid (about 37% by weight) and 4 ml of isopropanol. The solution then contains tetrachloride palladium ions ($PdCl_4^2$), which can be reduced to palladium.

The pattern 2 is exposed via a rectangular diaphragm by a laser in such a manner that at the area of the aperture 3 a rectangular luminous spot 6 is imaged. At that area, the laser radiation is incident upon the photosensitive layer 4, which absorbs the radiation, while free electrons are generated. At the surface, the electrons are transferred to the solution 5, where they reduce the tetrachloride palladium ions to palladium 7, which is deposited on the mask at the area of the aperture 3. As soon as such a quantity of palladium has been deposited that the photosensitive layer 4 has become inaccessible for the laser radiation, the deposition of palladium is automatically stopped. At that very instant, the palladium deposit 7 has obtained the light tightness required for the mask and the mask defect 3 has been restored.

Figure 8:
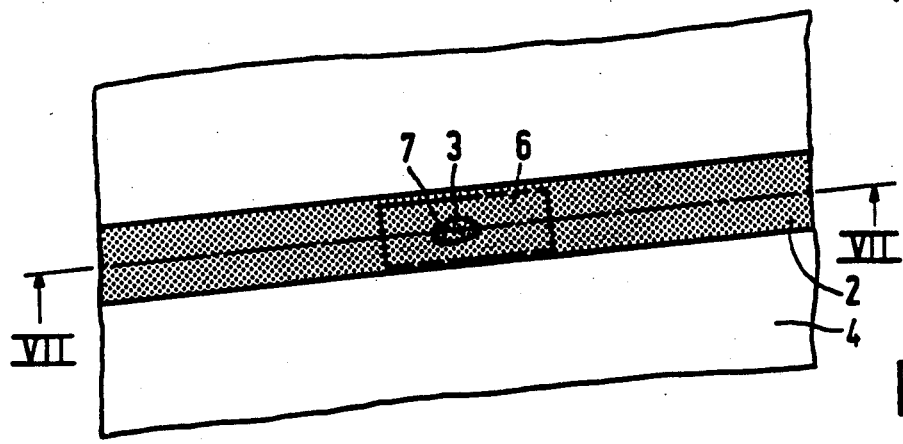

By varying the length and the width of the diaphragm, the dimensions of the luminous spot 6 can be varied. Due to the fact that in this example the photosensitive layer 4 is situated below the mask pattern 2, the dimensions of the luminous spot 6 can be adjusted comparatively coarsely. The mask pattern 2 itself screens the photosensitive layer 4 outside the aperture 3 from the radiation supplied (see FIGS. 7 and 8), so that deposition of palladium outside the aperture 3 is thus counteracted in a simple manner.

Figure 9:
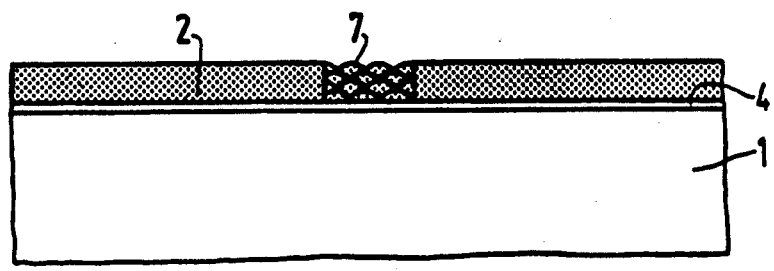

In this example, the exposure is also effected by an argon laser having a wavelength in the UV range between 350 and 365 nm. In contrast with the preceding example, however, in this case the laser is not operated at a continuous power. Initially, a comparatively high power of, for example, about 3 W is used. Due to the high intensity of the laser beam, a very large number of palladium nuclei 7 are then deposited within a short time at the area of the aperture 3 on the photosensitive layer 4. The ultimate palladium deposit 7 consequently has a comparatively large number of adhesion points to the photosensitive layer 4, which increases the resistance to scratching and wear. In order to counteract boiling phenomena, the laser power is attenuated after about 10 ms to about 300 mW, the palladium deposition being continued at a low level until the deposit 7 is light-tight. FIG. 9 shows a plan view cross-section of the mask after it had been restored in accordance with the invention. The palladium deposit 7 has proved to have a particularly satisfactory adhesion to the substrate.

Although the invention has been described with reference to the above embodiments, the invention is not limited thereto at all. Within the scope of the invention, many further variations are possible for those skilled in the art. For example, it is possible to expose the mask through the substrate during the restoration of the mask. If the photosensitive layer has been provided after the mask pattern, the screening effect of the mask pattern may then be utilized in a manner similar to that in the second embodiment. As a result, the exposure may be effected in a less critical manner.

Moreover, instead of by a laser, the exposure may also be carried out by another radiation source, such as, for example, a high-pressure mercury lamp. With the aid of lenses and other optical auxiliary means, the radiation may be focused on the aperture. The wavelength of the radiation and the kind of radiation is determined only by the photosensitive layer used. Although in the embodiments described a rectangular luminous spot having variable dimensions always was imaged, this in itself is not essential to the invention. For example, the invention may also be carried out by a differently shaped luminous spot or by a luminous spot having fixed dimensions.

Further, the invention is not limited to the given examples of metal ion solutions. In principle, the invention may be used with any solution containing ions of a sufficiently rare metal, such as besides gold and palladium, for example also silver, rhodium, platinum or copper.

We claim:

1. A method of repairing a defect in a mask pattern of a lithographic mask comprising the steps of
   (a) providing a mask with a photosensitive layer,
   (b) introducing said mask and photosensitive layer into a solution of a metal ion,
   (c) exposing said mask and photosensitive layer through a radiation diaphragm corresponding to interruptions in said mask to radiation having a wavelength to be absorbed by said photosensitive layer,
   (d) forming free electrons from exposed portions of said photosensitive layer, said free electrons converting said metal ion of said solution into metal at said interruptions, and
   (e) automatically ending said conversion upon reaching a thickness of said metal at said interruptions that substantially prevents said radiation from penetrating to said photosensitive layer.

2. A method according to claim 1, wherein said radiation is provided at ultraviolet wavelengths.

3. A method according to claim 2, wherein said radiation is provided at a wavelength between about 350 to about 365 nm.

4. A method according to claim 2, wherein said radiation is provided by a laser operating under continuous power.

5. A method according to claim 4, wherein said continuous power is substantially 100 mW.

6. A method according to claim 2, wherein said radiation is provided by a laser operating under an initial high power followed by low power operation.

7. A method according to claim 6, wherein said high power is about 3W applied for about 10 msec, and said low power is about 300 mW.

8. A method according to claim 1, wherein said radiation exposes said mask through a transparent substrate.

9. A method according to claim 1, wherein said photosensitive layer is a material selected from a group consisting of titanium dioxide, indium tin oxide, and zinc oxide.

10. A method according to claim 1, wherein said mask is covered with a protective top layer after said metal has been deposited in said interruptions.

11. A method according to claim 10, wherein said protective top layer is formed of a silicon oxide layer.

12. A method according to claim 10, wherein said protective top layer is formed of titanium dioxide.

13. A method according to claim 1, wherein said mask is provided between said photosensitive layer and said radiating diaphragm.

14. A method according to claim 13, wherein said radiation is provided by a laser operating under an initial high power followed by low power operation.

15. A method according to claim 14, wherein said high power is about 3W applied for about 10 msec, and said low power is about 300 mW.

16. A method according to claim 1, wherein said radiation diaphragm has adjustable lengths and widths.

17. A method according to claim 1, wherein said solution contains one of gold (I) sulphite ions which can be reduced to gold metal or tetrachloride palladium ions which can be reduced to palladium metal.

18. A method according to claim 1, wherein said solution further contains a reducing agent.

19. A method according to claim 18, wherein said reducing agent is an alcohol.

20. A method according to claim 19, wherein said alcohol is one of isopropanol, methanol or ethanol.

21. A method according to claim 1, wherein said photosensitive layer is formed to a thickness of between about 5 to about 20 nm.

* * * * *